US012713854B2

(12) United States Patent
Sherpa et al.

(10) Patent No.: US 12,713,854 B2
(45) Date of Patent: Aug. 18, 2026

(54) REMOVAL OF ORGANIC MATERIAL FROM HIGH ASPECT RATIO STRUCTURES

(71) Applicant: Applied Materials, Inc., Santa Clara, CA (US)

(72) Inventors: Sonam Dorje Sherpa, Santa Clara, CA (US); Alok Ranjan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 185 days.

(21) Appl. No.: 18/591,129

(22) Filed: Feb. 29, 2024

(65) Prior Publication Data

US 2025/0279284 A1 Sep. 4, 2025

(51) Int. Cl.
*H10P 50/28* (2026.01)
*H10P 50/00* (2026.01)
*H01J 37/32* (2006.01)

(52) U.S. Cl.
CPC ............ *H10P 50/287* (2026.01); *H10P 50/73* (2026.01); *H01J 37/32128* (2013.01); *H01J 37/32724* (2013.01); *H01J 2237/3341* (2013.01)

(58) Field of Classification Search
None
See application file for complete search history.

(56) References Cited

U.S. PATENT DOCUMENTS 6,635,185 B2 * 10/2003 Demmin ........... H01L 21/32137 257/E21.252
9,005,548 B2 4/2015 Henry et al.
9,666,446 B2 5/2017 Tominaga et al.
11,087,989 B1 8/2021 Garcia De Gorordo et al.
11,462,388 B2 10/2022 Dorf et al.
2003/0192856 A1 10/2003 Balasubramaniam et al.
2007/0254486 A1 11/2007 Bera et al.
2015/0126033 A1 5/2015 LeFevre et al.
2019/0088470 A1 * 3/2019 Varaprasad ....... H01L 21/02071
2021/0210355 A1 7/2021 Ventzek et al.
2021/0398815 A1 * 12/2021 Garcia De Gorordo .................... H01L 21/02348
2023/0035021 A1 * 2/2023 Yokoi ................. H01J 37/3244

FOREIGN PATENT DOCUMENTS

WO WO-2023107867 A1 * 6/2023 ....... H01L 21/68714

OTHER PUBLICATIONS

International Search Report and Written Opinion dated May 30, 2025 for Application No. PCT/US2025/017150.

* cited by examiner

*Primary Examiner* — Duy Vu N Deo
*Assistant Examiner* — Andrew Keelan Laobak
(74) *Attorney, Agent, or Firm* — Patterson + Sheridan, LLP

(57) ABSTRACT

Embodiments of the disclosure include a method of device processing, comprising: exposing a device substrate to a carbon-free fluorine-containing gas for a first period of time, delivering an inert gas to the processing volume for a second period of time; and removing a organic fill material of the device substrate by generating a plasma over the device substrate, wherein the plasma comprises the inert gas. The device substrate comprises one or more layers disposed on the device substrate, wherein the one or more layers define at one or more high-aspect ratio (HAR) features, wherein the HAR feature includes sidewall surfaces and a bottom surface and the organic fill material disposed within the one or more HAR features.

20 Claims, 8 Drawing Sheets

REMOVAL OF ORGANIC MATERIAL FROM HIGH ASPECT RATIO STRUCTURES

BACKGROUND

Field

Embodiments of the present disclosure generally relate to a system used in semiconductor device manufacturing. More specifically, embodiments of the present disclosure relate to a plasma processing system used to process a substrate.

Description of the Related Art

Reliably producing high aspect ratio features is one of the key technology challenges for the next generation of semiconductor devices. One method of forming high aspect ratio features uses a plasma-assisted etching process to bombard a material formed on a surface of a substrate through openings formed in a patterned mask layer formed on the substrate surface. In a typical plasma-assisted etching process, the substrate is positioned on an electrostatic chuck (ESC) disposed in a processing chamber, a plasma is formed over the substrate by use of a radio frequency (RF) source that is coupled to an electrode disposed on or within the plasma processing chamber, and ions are accelerated from the plasma towards the substrate across a plasma sheath.

With technology nodes advancing towards 2 nm, the fabrication of smaller features with larger aspect ratios requires higher precision for plasma processing. One particular challenge is the removal of organic materials from high aspect ratio features. Conventional methods lack selectivity for the organic materials over silicon-containing materials, and fail to adequately remove the organic materials from corners, indentations, and undercuts. Therefore, conventional methods of removing organic materials has been challenging, and often lead to poor or inconsistent process results. Accordingly, there is need in the art for improved methods of removing organic materials from high aspect ratio features.

SUMMARY

Embodiments provided herein generally include a method for plasma processing of a substrate in a processing chamber. More specifically, embodiments provided herein provide for a selective organic material removal process.

Embodiments of the disclosure include a method of forming a device, comprising: exposing a device substrate to a carbon-free fluorine-containing gas for a first period of time, wherein the device substrate is disposed within a processing volume of a processing chamber, wherein the device substrate comprises: one or more layers disposed on the device substrate, wherein the one or more layers define at one or more high-aspect ratio (HAR) features, wherein the HAR feature includes sidewall surfaces and a bottom surface; and an organic fill material disposed within the one or more HAR features; delivering an inert gas to the processing volume for a second period of time; and removing the organic fill material by generating a plasma over the device substrate, wherein the plasma comprises the inert gas.

Embodiments of the disclosure include a method of forming a device, comprising the following processes. Exposing a device substrate to a carbon-free fluorine-containing gas for a configurable exposure period, wherein the carbon-free fluorine-containing gas comprises fluorine, and the device substrate is disposed within a processing volume of a processing chamber. The device substrate comprises: one or more layers disposed on the device substrate, wherein the one or more layers define at one or more high-aspect ratio (HAR) features, wherein the HAR feature includes sidewall surfaces and a bottom surface; a hardmask material disposed above the one or more layers, wherein the hardmask material includes silicon nitride, silicon oxide, amorphous carbon, metals films, metal oxides, polymers, organosilicates, or combination thereof; and an organic fill material disposed within the one or more HAR features, wherein the organic fill material. Delivering an inert gas to the processing volume for a configurable purge period; and removing the organic fill material, wherein removing the organic fill material comprises a plasma-assisted etching process. The plasma-assisted etching process comprising: delivering an inert gas to the processing volume of the processing chamber; delivering an RF waveform according to an RF delivery period duty cycle, wherein the RF delivery period duty cycle comprises a ratio of delivering the RF waveform for a first period of time to halting delivery of the RF waveform for a second period of time; and biasing the device substrate. The process of the device substrate comprises delivering a PV burst according to a PV burst delivery period duty cycle to an electrode disposed within the processing chamber, wherein the PV burst delivery period duty cycle comprises a ratio of delivering the PV burst for a first period of time to halting the delivery of the PV burst for a second period of time, wherein the PV burst comprises: a PV waveform, the PV waveform having a PV waveform duty cycle comprising a ratio of delivering a first voltage for a first period of time to halting delivery of the first voltage for a second period of time.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

With technology nodes advancing towards 2 nm, the fabrication of smaller features with larger aspect ratios requires higher precision for plasma processing. One particular challenge is the removal of organic materials from high aspect ratio features. Conventional methods lack selectivity for the organic materials over silicon-containing materials, and fail to adequately remove the organic materials from corners, indentations, and undercuts. Therefore, conventional methods of removing organic materials has been challenging, and often leads to poor or inconsistent process results. Embodiments described herein offer an improvement over conventional methods, allowing for improved, or complete removal, of undesirable organic materials in corners, undercuts, and other hard-to-reach areas of features with high aspect ratios.

Plasma Processing System Example

Figure 1:
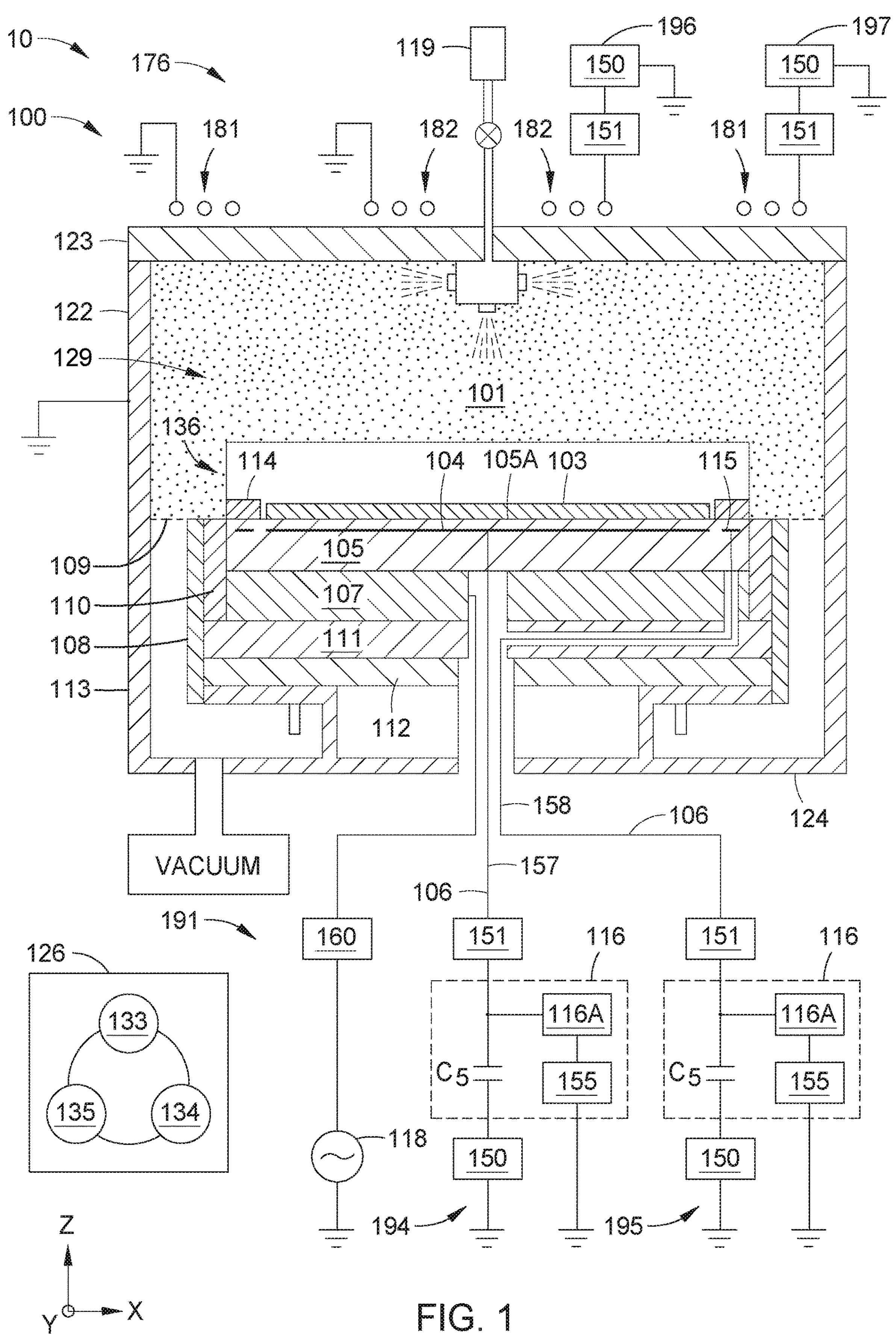
FIG. 1 is a schematic side cross-sectional view of a plasma processing system, according to one or more embodiments, configured to practice the methods set forth herein.

FIG. 1 is a schematic cross-sectional view of a processing system 10 that is configured to perform one or more of the plasma processing methods set forth herein. In some embodiments, the processing systems 10 is configured for plasma-assisted etching processes, such as a reactive ion etch (RIE) plasma processing. However, it should be noted that the embodiments described herein may be also be used with processing systems configured for use in other plasma-assisted processes, such as plasma-enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

The processing system 10 generally includes a processing chamber 100, a lid assembly 176, a support assembly 136, and a system controller 126. As shown, the processing system 10 includes a plurality of plasma source assemblies that are each adapted to deliver a voltage waveform to one or more electrodes and/or one or more coils disposed within the processing chamber 100. In one configuration example, as shown in FIG. 1, the processing chamber 100 includes plasma source assemblies, such as a first inductively coupled plasma (ICP) assembly 196, and a second inductively coupled plasma (ICP) assembly 197 that each include a RF waveform generator 190 that is adapted to deliver an RF waveform, which is described in more detail below.

The processing chamber 100 typically includes a chamber body 113 that includes one or more sidewalls 122 and a chamber base 124, which collectively, with the chamber lid 123 of the lid assembly 176, define the processing volume 129. The one or more sidewalls 122 and chamber base 124 generally include materials that are sized and shaped to form the structural support for the elements of the processing chamber 100 and are configured to withstand the pressures and added energy applied to them while a plasma 101 is generated within a vacuum environment maintained in the processing volume 129 of the processing chamber 100 during processing. In one example, the one or more sidewalls 122 and chamber base 124 are formed from a metal, such as aluminum, an aluminum alloy, or a stainless steel alloy. A gas inlet 128 disposed through the chamber lid 123 is used to deliver one or more processing gases to the processing volume 129 from a processing gas source 119 that is in fluid communication therewith. A substrate 103 is loaded into, and removed from, the processing volume 129 through an opening (not shown) in one of the one or more sidewalls 122, which is sealed with a slit valve (not shown) during plasma processing of the substrate 103.

The system controller 126, also referred to herein as a processing chamber controller, includes a central processing unit (CPU) 133, a memory 134, and support circuits 135. The system controller 126 is used to control the process sequence used to process the substrate 103, including the substrate biasing methods described herein. The CPU 133 is a general-purpose computer processor configured for use in an industrial setting for controlling the processing chamber and sub-processors related thereto. The memory 134 described herein, which is generally non-volatile memory, may include random access memory, read-only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing system 10. Typically, the software program, which is readable by CPU 133 in the system controller 126, includes code, which, when executed by the processor (CPU 133), performs tasks relating to the plasma processing methods described herein. The program may include instructions that are used to control the various hardware and electrical components within the processing system 10 to perform the various process tasks and various process sequences used to implement the methods described herein.

In some embodiments, the lid assembly 176 includes a chamber lid 123 and the one or more plasma source assemblies, such as two inductively coupled plasma (ICP) assemblies 196, 197 illustrated in FIG. 1. As shown in FIG. 1, each ICP assembly 196, 197 includes a coil 181, 182, respectively, that is configured to inductively couple a radio frequency (RF) waveform generated by a RF waveform generator 190 to a plasma 101 formed in the processing volume 129 of the processing chamber 100 during plasma processing. In this configuration, the chamber lid 123 includes a dielectric material that is configured to allow the fields generated by the coils 181, 182 during the delivery of a voltage waveform by the RF waveform generator 190 to help generate and sustain the plasma 101 in the processing volume 129. In some embodiments, the chamber lid 123 can include a dielectric material or structural material (e.g., metal) that is configured to withstand the vacuum created in the processing volume 129 during processing. In some embodiments, the RF waveform generators 190 is configured to deliver an RF signal to one or more of the coils 181, 182 within the processing chamber 100, to initially generate (e.g., ignite), and maintain, the plasma 101 in a processing volume 129. In some embodiments, the RF waveform generator 190 is configured to deliver an RF waveform signal having a frequency that is greater than 1 MHz or more, or about 2 MHz or more, such as about 13.56 MHz or more through an RF match 191 that is connected to an RF electrode or coil.

The substrate support assembly 136, as shown in FIG. 1, includes a substrate support 105 (e.g., ESC substrate support) and one or more lower electrodes, which are coupled to a plasma source, such as the inductively coupled plasma (ICP) assemblies 196, 197. In some embodiments, the substrate support assembly 136 can additionally include a support base 107, an insulator plate 111, and a ground plate 112. The support base 107 is electrically isolated from the chamber base 124 by the insulator plate 111, and the ground plate 112 is interposed between the insulator plate 111 and the chamber base 124. The substrate support 105 is thermally coupled to and disposed on the support base 107. In some embodiments, the support base 107 is configured to regulate the temperature of the substrate support 105, and the substrate 103 disposed on the substrate support 105, during substrate processing. Typically, the substrate support 105 is formed of a dielectric material, such as a bulk sintered ceramic material, such as a corrosion-resistant metal oxide or metal nitride material, for example, aluminum oxide ($Al_2O_3$), aluminum nitride (AlN), titanium oxide (TiO), titanium nitride (TiN), yttrium oxide ($Y_2O_3$), mixtures thereof, or combinations thereof. In some embodiments, the substrate support assembly 136 may include a heater (not shown), cooling passages (not shown), or both, to heat, cool, or maintain, the substrate supporting surface 106A of the substrate support 105, and the substrate 103 disposed upon the substrate supporting surface 106A, between about −200° C. to about 400° C. during the operations of the methods described herein.

In embodiments herein, the substrate support 105 further includes the bias electrode 104 embedded in the dielectric material thereof. The one or more lower electrodes can include a bias electrode 104 and/or an edge control electrode 115 that are formed within the substrate support 105, and are coupled to one or more plasma source assemblies, such as the PV source assemblies 194, 195. The PV source assembly 194 is coupled to the bias electrode 104 and the PV source assembly 195 is coupled to the edge control electrode 115, and are each configured to deliver a PV waveform generated by a PV waveform generator 150 to a plasma 101 formed in the processing volume 129 of the processing chamber 100 during plasma processing. In one embodiment, which is not shown in FIG. 1, a PV waveform generator 150 of PV source assembly 194 is configured to bias both the bias electrode 104 and the edge control electrode 115, and thus the PV source assembly 195 and its components are not needed to deliver PV waveforms to the bias electrode 104 and the edge control electrode 115.

In one configuration, the bias electrode 104 is a chucking pole used to secure (i.e., chuck) the substrate 103 to the substrate supporting surface 106A of the substrate support 105 and to bias the substrate 103 with respect to the processing plasma 101 using one or more of the pulsed-voltage biasing schemes described herein. Typically, the bias electrode 104 is formed of one or more electrically conductive parts, such as one or more metal meshes, foils, plates, or combinations thereof.

The PV source assemblies 194, 195 may also each include a clamping network 116 so that a high voltage bias applied to the bias electrode 104 and/or edge control electrode 115. In some embodiments, the bias electrode 104 is electrically coupled to a clamping network 116 and the edge control electrode 115 is electrically coupled to a clamping network 116. The clamping networks provide a chucking voltage thereto, such as static DC voltage between about −6000 V and about +6000 V, using an electrical conductor, such as the coaxial power delivery line 106 (e.g., a coaxial cable). The clamping network 116 includes bias compensation circuit elements 116A, a DC power supply 155, and a bias compensation module blocking capacitor, which is also referred to herein as the blocking capacitor $C_5$. The blocking capacitor $C_5$ is disposed between the output of a pulsed voltage (PV) waveform generator 150 and the bias electrode 104. Applying similarly configured PV waveforms and clamping voltages to the bias electrode 104 and edge control electrode 115 can help improve the plasma uniformity across the surface of the substrate during processing and thus improve the plasma processing process results.

As discussed above, in some embodiments, the substrate support assembly 136 include the edge control electrode 115 that is positioned below the edge ring 114 and surrounds the bias electrode 104 and/or is disposed a distance from a center of the bias electrode 104. In general, for a processing chamber 100 that is configured to process circular substrates, the edge control electrode 115 is annular in shape, is made from a conductive material, and is configured to surround at least a portion of the bias electrode 104. In some embodiments, such as shown in FIG. 1, the edge control electrode 115 is positioned within a region of the substrate support 105. In some embodiments, as illustrated in FIG. 1, the edge control electrode 115 includes a conductive mesh, foil, and/or plate that is disposed a similar distance (i.e., Z-direction) from the substrate supporting surface 106A of the substrate support 105 as the bias electrode 104. In some other embodiments, the edge control electrode 115 includes a conductive mesh, foil, and/or plate that is positioned on or within a region of a quartz pipe 110, which surrounds at least a portion of the bias electrode 104 and/or the substrate support 105. Alternately, in some other embodiments (not shown), the edge control electrode 115 is positioned within or is coupled to the edge ring 114, which is disposed on and adjacent to the substrate support 105. In this configuration, the edge ring 114 is formed from a semiconductor or dielectric material (e.g., AlN, etc.).

A power delivery line 157 electrically connects the output of the PV waveform generator 150 of the PV source assembly 195 to an optional filter assembly 151 and the bias electrode 104. While the discussion below primarily discusses the power delivery line 157 of the PV source assembly 194, which is used to couple a PV waveform generator 150 to the bias electrode 104, the power delivery line 158 of the PV source assembly 195, which couples a PV waveform generator 150 to the edge control electrode 115, will include the same or similar components. The electrical conductor(s) within the various parts of the power delivery line 157 may include: (a) one or a combination of coaxial cables, such as a flexible coaxial cable that is connected in series with a rigid coaxial cable, (b) an insulated high-voltage corona-resistant hookup wire, (c) a bare wire, (d) a metal rod, (e) an electrical connector, or (f) any combination of electrical elements in (a)-(e). The optional filter assembly 151 includes one or more electrical elements that are configured to reduce or prevent a current generated by one or more of the plasma sources from flowing through the power delivery line 157 and damaging the PV waveform generator 150.

In some embodiments, the processing chamber 100 further includes the quartz pipe 110, or collar, that at least partially circumscribes portions of the substrate support assembly 136 to prevent the substrate support 105 and/or the support base 107 from contact with corrosive processing gases or plasma, cleaning gases or plasma, or byproducts thereof. Typically, the quartz pipe 110, the insulator plate 111, and the ground plate 112 are circumscribed by a liner 108. In some embodiments, a plasma screen 109 is positioned between the cathode liner 108 and the sidewalls 122 to prevent plasma from forming in a volume underneath the plasma screen 109 between the liner 108 and the one or more sidewalls 122.

In some embodiments, a PV waveform generator 150 can be adapted to provide a voltage waveform to a plurality of electrodes within the processing chamber 100. In some cases, the PV waveform generator 150 can be used within one or more of the plasma source assemblies 194-195. The PV waveform will typically oscillate at about 400 kilohertz (KHz). A PV waveform generator 150 will typically include a PV source controller and at least one voltage source assembly that includes a voltage source that is configured to provide a PV waveform to at least one generator output that is coupled to one or more of the electrodes and/or coils. In some embodiments, the PV waveform generator 150 is a switch-mode power supply. In some embodiments, each of the PV waveform generators 150 are configured to deliver between 10 and 25 kilowatts (KW) of DC power to a coil.

Figure 2:
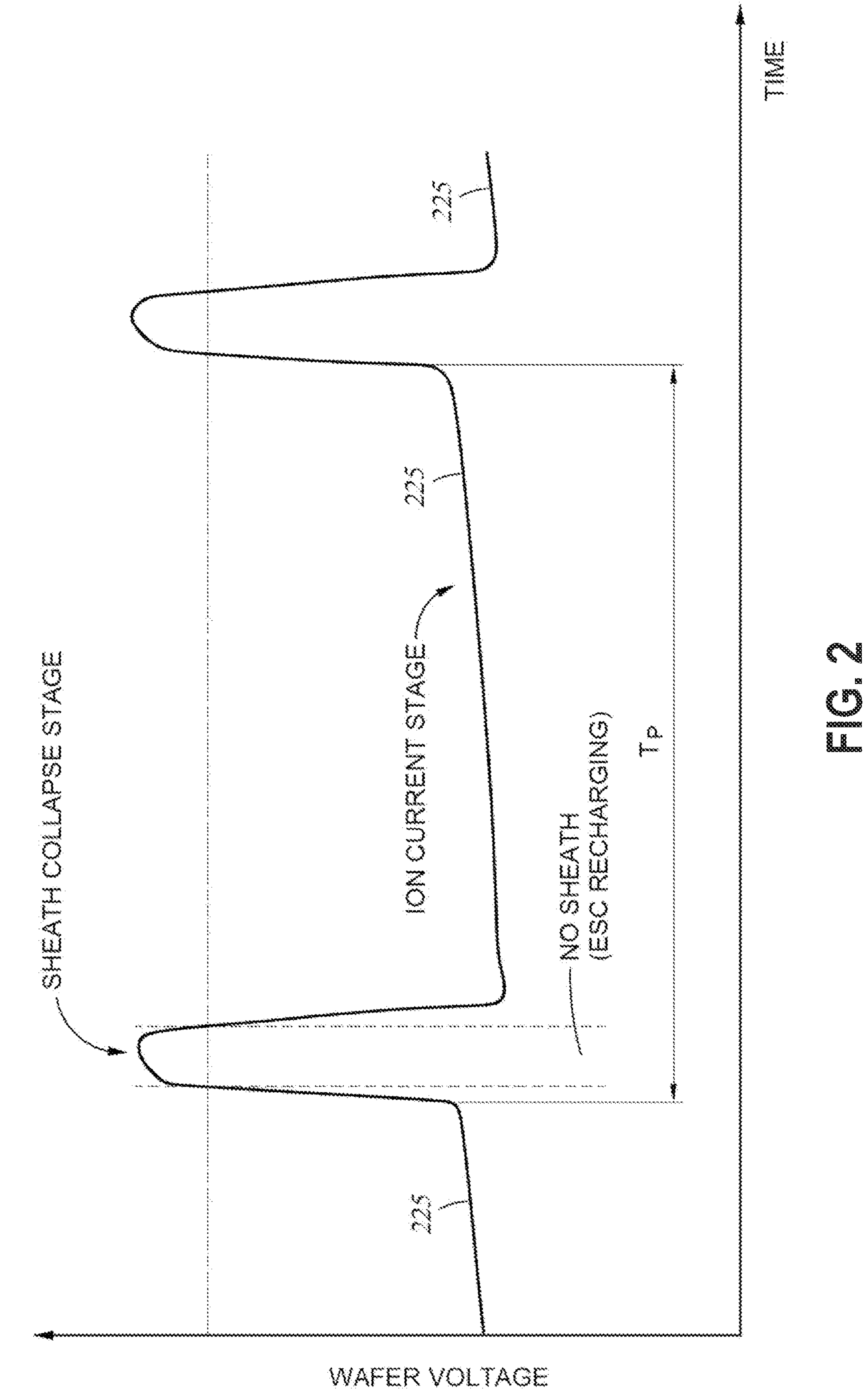
FIG. 2 illustrates a graph of a voltage waveform that is established on a substrate due to a voltage waveform applied to an electrode within a processing chamber, in accordance with certain embodiments of the present disclosure.

FIG. 2 illustrates a graph 200 of a typical separate voltage waveform established at the substrate 103 disposed on the substrate supporting surface 106A of the substrate support assembly 136 of the processing chamber 100 due to the delivery of PV waveforms to the at least the bias electrode 104 of the processing chamber 100. A first waveform (e.g., a waveform 225) is an example of a non-compensated PV waveform established at the substrate 103 during the plasma processing. The PV waveform cycle of the waveform 225 has a period $T_p$, which is, for example, typically between 2 microseconds (μs) and 10 μs, such as 2.5 μs. The ion current stage of the PV waveform cycle will typically take up between about 50% and about 95% of the period $T_p$, such as from about 80% to about 90% of the period $T_p$.

The waveform 225 includes two main stages: an ion current stage and a sheath collapse stage. Both portions (e.g., the ion current stage and the sheath collapse stage) of the waveforms 225 can be alternately and/or separately established at the substrate 103 during the plasma processing. At a beginning of the ion current stage, a drop in the voltage at the substrate 103 is created, due to the delivery of a negative portion of the PV waveform (e.g., the ion current portion) provided to the bias electrode 104 by the PV waveform generator 150, which creates a high voltage sheath above the substrate 103. The high voltage sheath allows the plasma generated positive ions to be accelerated towards the biased substrate 103 during the ion current stage, and thus, for RIE processes, controls the amount and characteristics of the etching process that occurs on the surface of the substrate 103 during the plasma processing. The sheath collapse stage includes a positive voltage swing 240 (e.g., because of the positive wafer voltage), and the ion current stage includes a negative voltages swing (e.g., because of the positive wafer voltage), as illustrated in FIG. 2.

One will note that significant variations in the voltage established at the substrate 103 during the ion current stage, such as shown by the positive slope in the waveform 225, will undesirably cause a variation in the ion energy distribution (IED) and thus cause undesirable characteristics of the etched features to be formed in the substrate 103 during the RIE process. Plasma sheath impedance varies with supplied PV waveform voltages.

In some embodiments of the inductively coupled plasma (ICP) assemblies 196, 197, the RF match 191 can use either or both of the synchronization signals and/or use its internal sensors to sample impedances in different processing phases of a delivered PV waveform provided from a pulsed voltage (PV) waveform generator 150. In one example, a synchronization signal or characteristics determined by an input sensor or an output sensor are used to trigger the RF match 191 to determine at least two different impendences at different processing stages. Then, the RF match 191 updates its matching point based on the at least two different impedances.

Example Process Sequence

Figure 3:
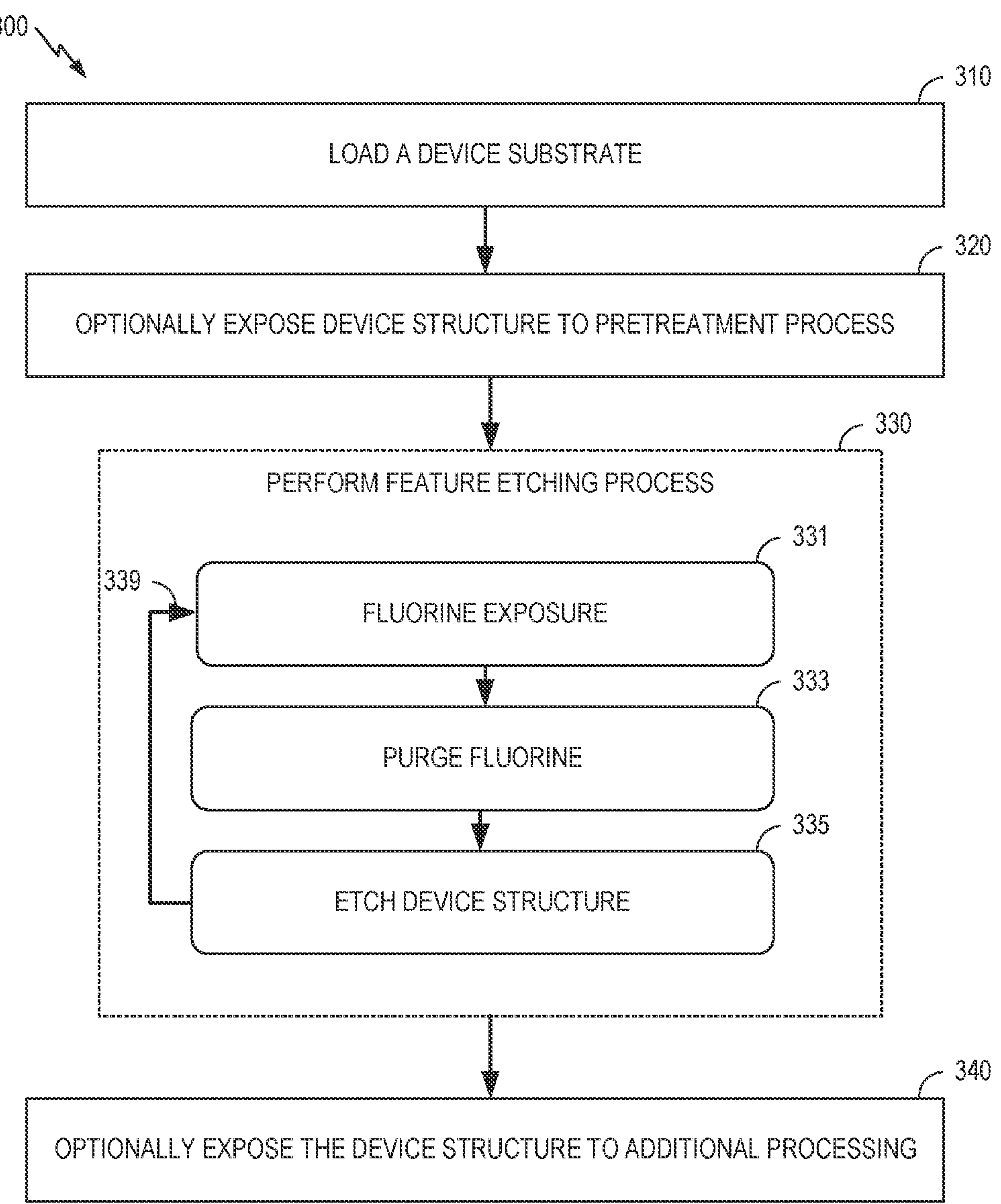
FIG. 3 is a process flow diagram illustrating a method of plasma processing, according to one or more of the embodiments described herein.

FIG. 3 illustrates a process flow diagram illustrating a method 300 of removal of organic material from high aspect ratio structures, according to one or more of the embodiments described herein. FIG. 3 may be understood with reference to FIGS. 4, 5, and 6A-6C. FIGS. 6A-6C illustrate a device substrate 600 at various stages of method 300, according to one or more of the embodiments described herein. Although FIGS. 6A-6C are described in relation to the method 300, it will be appreciated that the structures disclosed in FIGS. 6A-6C are not limited to the method 300, but instead may stand alone as structures independent of the method 300. Similarly, although the method 300 is described in relation to FIGS. 6A-6C, it will be appreciated that the method 300 is not limited to the structures disclosed in FIGS. 6A-6C but instead may stand alone independent of the structures disclosed in FIGS. 6A-6C. It should be understood that FIGS. 6A-6C illustrate only partial schematic views of the device substrate 600, and the device substrate 600 may contain any number of features, sections, and additional materials having aspects as illustrated in the figures. It should also be noted that although the method 300 illustrated in FIG. 3 is described sequentially, other process sequences that include one or more operations that have been omitted and/or added, and/or has been rearranged in another desirable order, fall within the scope of the embodiments of the disclosure provided herein.

Referring to FIG. 6A, at operation 310, a device substrate 600 having at least one feature formed therein is loaded onto the substrate support assembly 136. FIG. 6A illustrates a cross-sectional view of the device substrate 600 during intermediate stages of manufacturing corresponding to the operation 310.

The device substrate 600 includes a device substrate 602. The device substrate 602 may be or include a bulk semiconductor substrate, a semiconductor-on-insulator (SOI) substrate, or the like, which may be doped (e.g., with a p-type dopant or an n-type dopant) or undoped. In some embodiments, the semiconductor material of the device substrate 602 may include an elemental semiconductor, for example, such as silicon (Si) or germanium (Ge); a compound semiconductor including, for example, silicon carbide, gallium arsenide, gallium phosphide, indium phosphide, indium arsenide, and/or indium antimonide; an alloy semiconductor including, for example, SiGe, GaAsP, AlInAs, GaInAs, GaInP, and/or GaInAsP; a combination thereof, or the like. The device substrate 602 may include additional materials, for example, silicide layers, metal silicide layers, metal layers, dielectric layers, etch stop layers, interlayer dielectrics, or a combination thereof.

The device substrate 602 may further include integrated circuit devices (not shown). As one of ordinary skill in the art will recognize, a wide variety of integrated circuit devices such as transistors, diodes, capacitors, resistors, the like, or combinations thereof may be formed in and/or on the device substrate 602 to generate the structural and functional requirements of the design for the resulting device substrate 600.

The device substrate 602 includes one or more layers disposed thereon, for example, a dielectric layer 604 as is shown in FIG. 6A. In other embodiments, the dielectric layers 604 may include silicon oxide, silicon nitride, dielectric materials, or combination thereof.

The dielectric layers 604 include sidewall surfaces 604*s*, and a bottom surface 604*b*. The sidewall surfaces 604*s* and bottom surface 604*b* defining one or more high-aspect ratio (HAR) features 612. In this embodiment, the dielectric layers 604 forming the HAR features 612 include an indentation 606, where the sidewall surfaces 604*s* deviate from a desired feature geometry (e.g., an approximately straight sidewall surface 604*s* about normal to the bottom surface 604*b*). While the indentation 606 is shown as an inset curved portion of the sidewall surfaces 604*s*, all manner of deviations from a desired feature geometry are intended to fall within the scope of the embodiments of the disclosure provided herein.

The device substrate 600 may include a hardmask material 610 deposited above the dielectric layers 604. The hardmask material 610 may include silicon nitride, silicon oxide, amorphous carbon, metals films, metal oxides, polymers, organosilicates, or combination thereof.

The device substrate 600 includes an organic fill material 608. The organic fill material 608 is deposited within the feature HAR feature 612. The organic fill material 608 may include any number of organic materials including, but not limited to, photoresists, spin-coated carbon, carbon-based materials, carbon-containing materials, backside antireflective coating (BARC), or combination thereof. In some embodiments, the organic fill material 608 may extend above the HAR feature 612.

Referring to FIG. 3, at operation 320 of method 300, the device substrate 600 may be exposed to a pretreatment process. The optional pretreatment process of operation 320 may include exposing the device substrate 600 to a cleaning process and/or a degas process prior to the subsequent operations of method 300. The cleaning process may be used to remove oxides or surface contaminants from the surface of the device substrate 600. The degas process may be used to remove foreign liquids or gases from the surface, or interior of the device substrate 600 by the application of a vacuum pressure, heat, or both.

Referring to FIG. 3, at operation 330 of method 300, a feature etching process is performed on the device substrate 600. The feature etching process of operation 330 includes four steps. The four steps of operation 330 may be understood with reference to FIG. 5, which illustrates an example timing diagram 500 of the steps of operation 330. During the steps of operation 330, in some embodiments, the device substrate 600 may be maintained at a cryogenic temperature, such as less than 0° C. In some embodiments, the temperature of the substrate is maintained at a temperature of less than −40° C., less than −80° C., or even less than −100° C. by use of cooling elements (not shown) formed in the support base 107 to regulate and control the temperature of the substrate positioned on the substrate support 105. In one example, the cooling elements formed in the support base 107 can include cooling channels that are in fluid communication with a recirculating fluid type cryogenic chiller.

The timing diagram 500 includes an x-axis 502 and a y-axis 504. The x-axis 502 plots the passage of time beginning at t=0 and increasing from left to right to t+n. The y-axis plots the state of the delivery of four different variables, the RF waveform, the PV waveform, the process gas (e.g., a carbon-free fluorine-containing gas), and the inert gas, as either ON state (i.e. a high-state 506) or OFF state (i.e., a low-state 508). During the period between t=0 to t+1, all four variables are shown in the OFF state. In practice, one or more of the variables, may be in an ON state before, or during, the period between t=0 to t+1.

At time increment t+1, step 331 of operation 330 begins, as indicated by the ON state in timing diagram 500, with delivery of the process gas 614, such as a carbon-free fluorine-containing gas. Looking to FIG. 6B, at step 331 of operation 330, the device substrate 600 is exposed to carbon-free fluorine-containing gas to the processing volume 129 where the carbon-free fluorine-containing gas reacts with organic material present on the device substrate 600. For example, the carbon-free fluorine-containing gas may include a vapor or gas may include fluorine ($F_2$), hydrogen fluoride (HF), deuterium fluoride (DF), a combination of fluorine and ammonia ($NH_3$), a combination of hydrogen ($H_2$) and nitrogen fluorides (e.g., $NF_2$, $NF_3$, et al.). Exposure of the device substrate 600 to the process gas 614 is performed by introducing, for example, a carbon-free fluorine-containing gas into the processing chamber 100 at a rate between about 100 standard cubic-centimeters per minute (SCCM) to about 1000 SCCM. The exposure of the device substrate 600 continues for a configurable exposure period. The configurable exposure period (i.e., time between time increments t+1 and t+2) is between about 1 second to about 5 minutes, such as 5 seconds to 3 minutes, or 10 seconds to 1 minute. For example, configurable exposure period lasts for about 1 minute, about 2 minutes, about 3 minutes, or even about 5 minutes. In other embodiments, the configurable exposure period is also pressure dependent rather than time dependent. The pressure of the carbon-free fluorine-containing gas 614 within the processing volume 129 during operation 330 is maintained between about 10 m Torr to about 200 mTorr. For example, the pressure of the carbon-free fluorine-containing gas 614 within the processing volume 129 during operation 330 is about 30 m Torr, is about 60 mTorr, is about 100 mTorr, or even is about 150 mTorr. Not to be bound by theory, but it is believed that the exposure of the organic fill material 608 to the carbon-free fluorine-containing gas increases the sensitivity of the of the organic fill material 608 to subsequent etching processes. The exposure to the process gas 614 of step 331 may leave a non-volatile reaction layer (not shown) on the device substrate 600. The non-volatile reaction layer includes any reaction products remaining on the device substrate 600, which do not readily evaporate or volatilize under typical processing conditions. The presence of the non-volatile reaction layer may have undesirable implications for the subsequent steps/operations of method 300, may interfere with device performance, affect film adhesion during later deposition processes, or cause defects in the final semiconductor product.

At time increment t+2, step 333 of operation 330 begins. As indicated by the OFF state in timing diagram 500, the delivery of the process gas ends. As indicated by the ON state in timing diagram 500, step 333 of operation 330 includes delivery of the inert gas. Delivering the inert gas (e.g., $N_2$, He, Ar, $H_2$, etc.) to the processing volume 129 during step 333 of operation 330 purges the process gas from the processing volume 129. Purging the process gas delivering the inert gas to the processing volume 129 continues for a configurable purge period. The configurable purge period ranges from about 1 minute to about 35 minutes. For example, configurable purge period lasts for about 1 minute, about 3 minutes, about 5 minutes, about 10 minutes, or about 30 minutes.

At time increment t+3, step 335 of operation 330 begins. Step 335 of operation 330 includes etching the device substrate to remove the organic fill material 608 and remove any non-volatile reaction layer. As indicated by the ON states in the timing diagram 500, at t+3, step 335 includes continuing the delivery of the inert gas to the processing volume 129 from step 333, and beginning delivery of the RF waveform 410 and beginning delivery of the PV burst 430.

Figure 4:
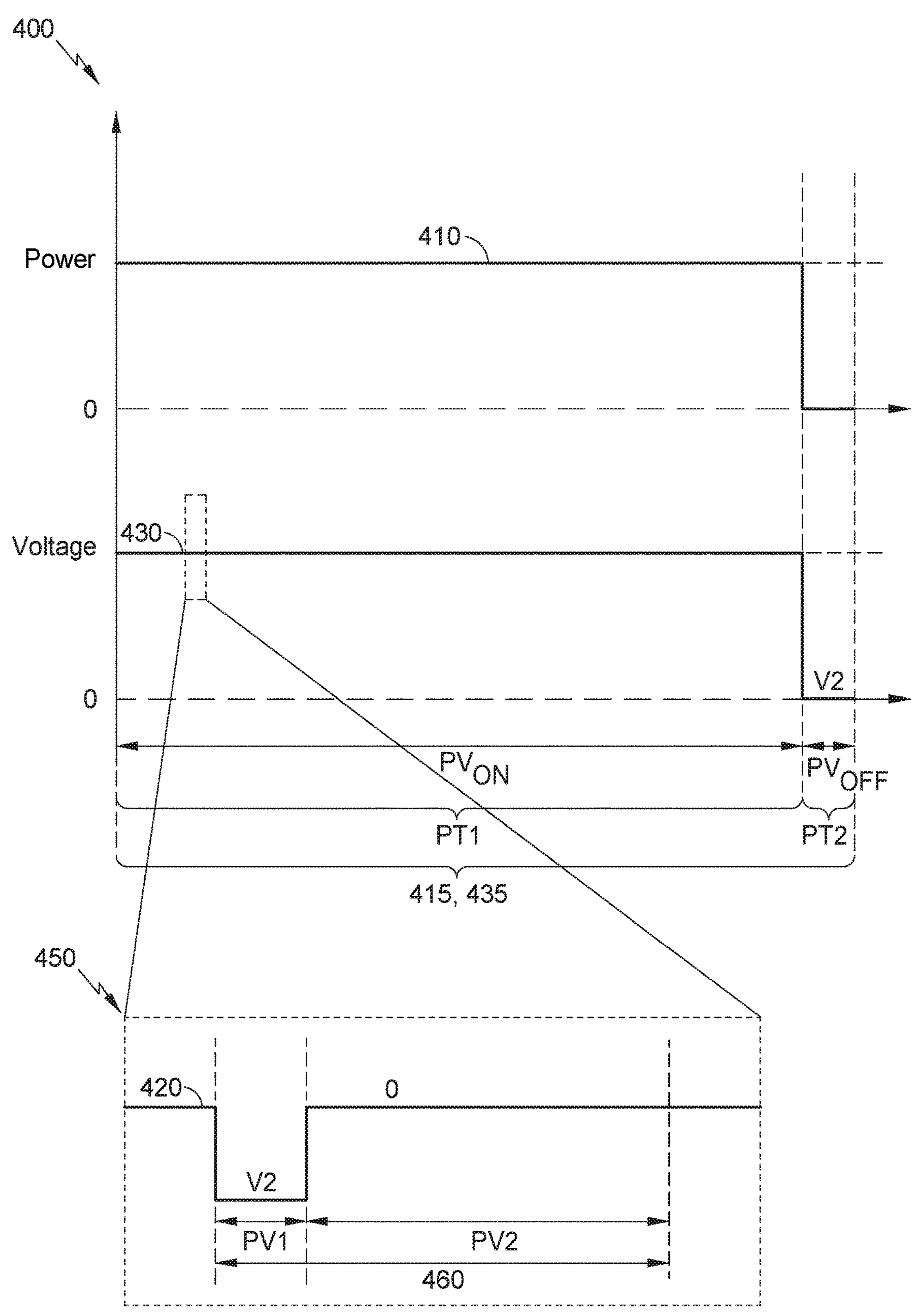
FIG. 4 illustrates a graph of example radio frequency (RF) generator power used to generate an RF waveform and example pulsed voltage (PV) used to generate a pulsed voltage waveform during the plasma processing, according to one or more of the embodiments described herein.
Figure 5:
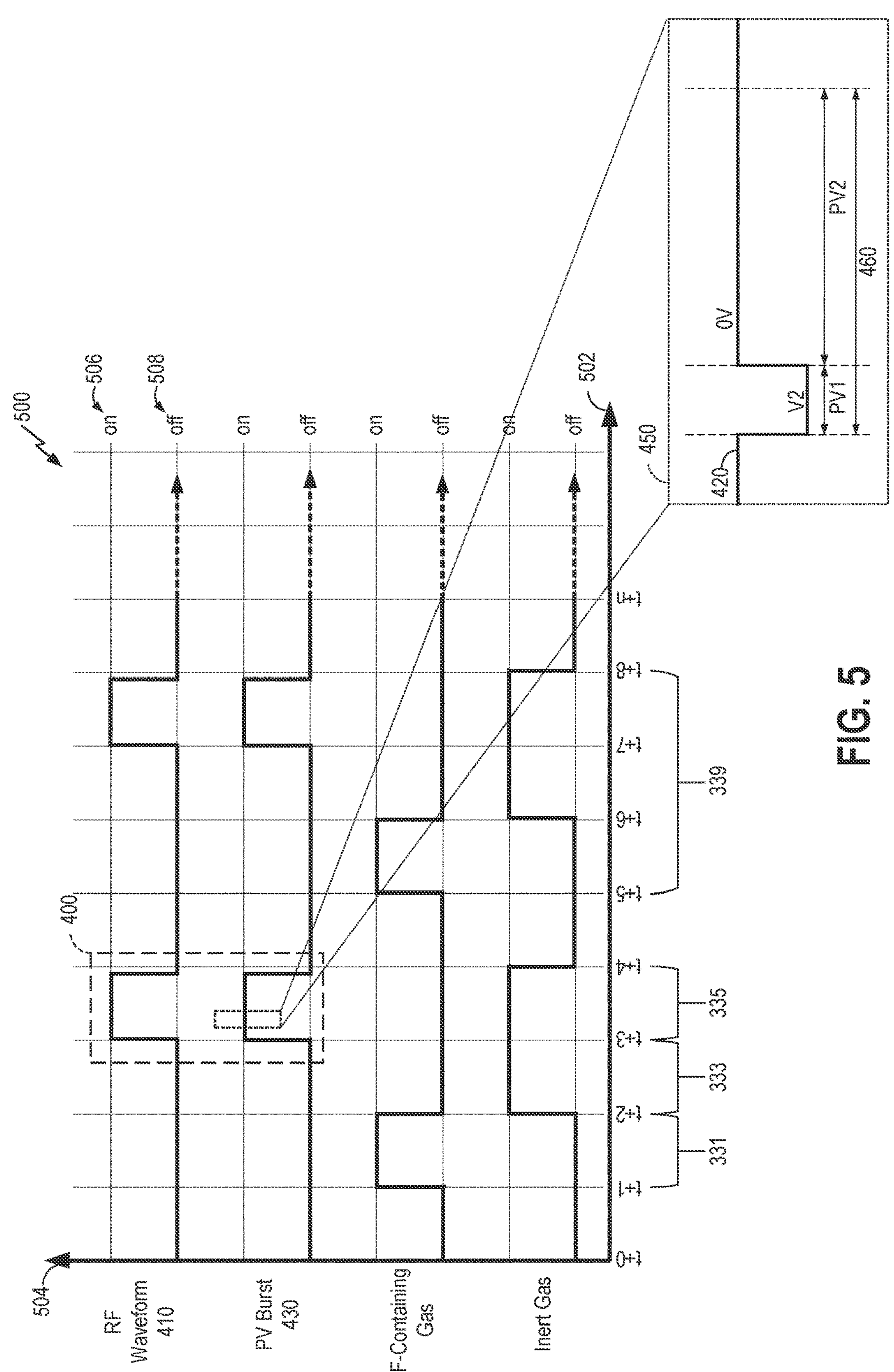
FIG. 5 illustrates an example timing diagram of a method of plasma processing, according to one or more of the embodiments described herein.
Figure 6A:
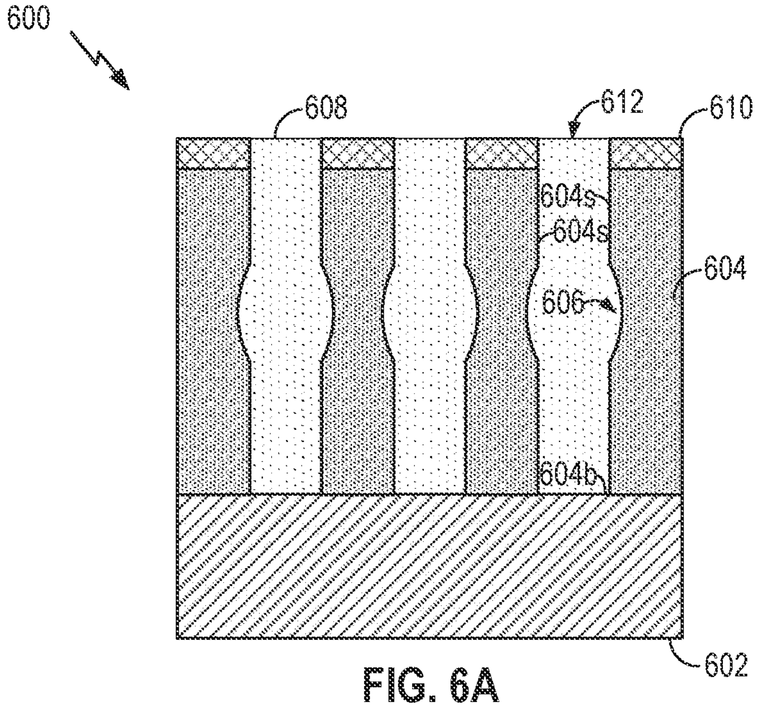
FIGS. 6A-6C illustrate views of various stages of manufacturing a semiconductor device, according to one or more of the embodiments described herein.
Figure 6B:
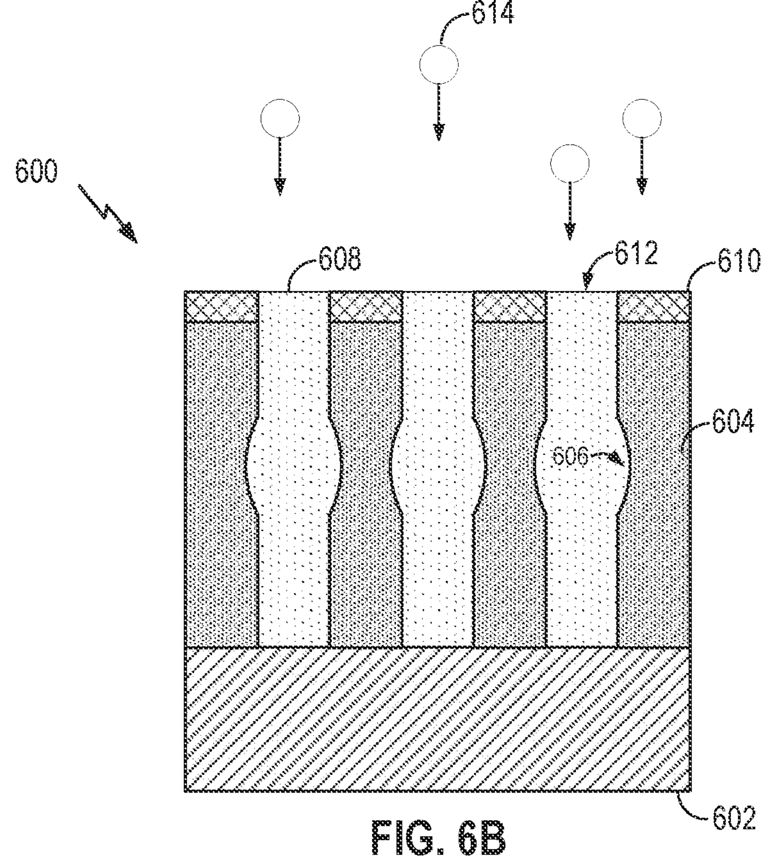
Figure 6C:
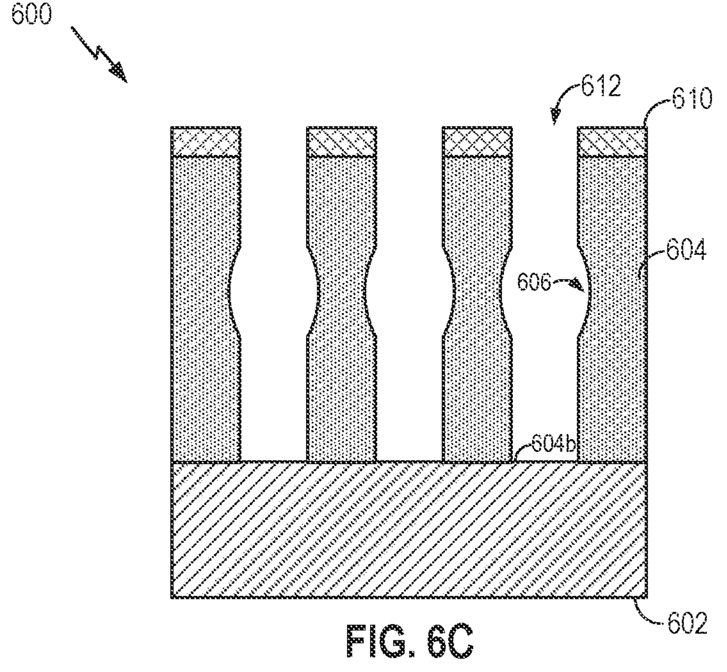

The RF waveform 410 and the PV burst 430 are shown having an equal ON period between t+3 to t+4 in the timing diagram 500 of FIG. 5. In some embodiments, the ON period of the RF waveform 410 and the PV bursts 430 may be not be equal. FIG. 4 illustrates a graph 400 of a showing an example RF generator power 410 used to generate an RF waveform and an example of a PV burst 430 of voltage pulses (e.g., a PV waveform 420) provided from a PV waveform generator 150 during step 335 to etch the device substrate 600.

Etching the device substrate 600 during step 335 includes delivering a RF waveform at an RF frequency for a first period of time PT1 and then halting the delivery of the RF waveform for a second period of time PT2 using a RF generator (e.g., RF generator 118.). In one embodiment, the RF waveform is a sinusoidal waveform with an RF frequency between about 1 MHz to about 20 MHz, for example about 13.5 MHz. In other embodiments, the RF waveform is a sinusoidal waveform with an RF frequency between about 0.5 MHz to about 10 MHz, for example, about 2 MHz.

The first period of time PT1 and the second period of time PT2 can be cyclically repeated to form a series of RF pulses that each have an RF delivery period 415 that is equal to the sum of the first period of time PT1 and the second period of time PT2. The ratio of the first period of time PT1 to the second period of time PT2 during a particular RF delivery period 415 is the RF delivery period duty cycle. For example, if a particular RF delivery period 415 lasted for 10 seconds, and the first period of time PT1 occupied 1 second, and the second period of time PT2 occupied 9 seconds, then the RF delivery period duty cycle would be 10%. In another example, if a particular RF delivery period 415 lasted for 1 second, and the first period of time PT1 and the second period of time PT2 occupied equal periods (i.e., 0.5 seconds) of the 1 second RF delivery period 415, then the RF delivery period duty cycle would be 50%. In this embodiment, the RF delivery period duty cycle is about 95%. In certain embodiments, the RF delivery period duty cycle may range between about 50% to about 100%.

Etching the device substrate 600 during step 335 of operation 330 additionally includes delivering a pulsed voltage (PV) burst 430 of voltage pulses from a PV waveform generator 150 within one or more of the PV waveform assembly 194, 195 within the processing chamber. Delivering the PV burst 430 includes delivering the voltage pulses for a first period of time $PV_{ON}$ and then halting the voltage waveform pulses for a second period of time $PV_{OFF}$ using the PV waveform generator 150. The first period of time $PV_{ON}$ and the second period of time $PV_{OFF}$ can be cyclically repeated to form a series of PV bursts that each have a PV burst delivery period 435 that is equal to the sum of the first period of time $PV_{ON}$ and the second period of time $PV_{OFF}$. The ratio of the first period of time $PV_{ON}$ to the second period of time $PV_{OFF}$ during a particular PV burst delivery period 435 comprise a PV burst delivery period duty cycle. In one embodiment, as shown in graph 400, the PV burst delivery period duty cycle is equal RF delivery period duty cycle. In some embodiments, the PV burst delivery period duty cycle may not be equal RF delivery period duty cycle.

While the PV burst 430 is illustrated in graph 400 as a constant voltage during the first period of time $PV_{ON}$, the PV burst 430 not a constant voltage, but in reality is a plurality of voltage pulses delivered at a first voltage V2 as illustrated by the PV waveform 420 in graph 450.

The voltage pulses at the first voltage V2 of the PV waveform 420 may be delivered at a PV waveform frequency between about 100 kHz and about 500 kHz. For example, the PV waveform frequency of the PV waveform 420 may be delivered, at about 100 kHz, at about 200 kHz, at about 300 kHz, at about 400 kHz, or over about 400 KHz. During each PV waveform period 460, the PV waveform generator 150 may provide a first voltage V2 from a PV waveform assembly 194, 195 to an electrode of processing chamber 100 for a first period of time PV1, and halt delivery of the first voltage V2 for a second period of time PV2 according to a PV waveform duty cycle. The ratio of the first period of time PV1 to the second period of time PV2 during a particular PV waveform period 460 is the PV waveform duty cycle. For example, if the PV waveform frequency were 1 kHz, the PV waveform period 460 would be 1 milli-second (ms). If, during that 1 ms, the first period of time PV1 was 0.5 ms and the second period of time PV2 was 0.5 ms, the PV waveform duty cycle would be 50%. In another example, if the PV waveform frequency were 400 kHz, the PV waveform period 460 would be 2.5 microseconds (μs). If, during that 2.5 μs, the first period of time PV1 was 0.5 μs and the second period of time PV2 was 2 μs, the PV waveform duty cycle would be 20%. In one embodiment of the present disclosure, the PV waveform duty cycle is between about 10% to about 50%. For example, PV waveform duty cycle is about 20%, is about 30%, or even about 40%. The first voltage V2 may be between about −10 V and −8000 V. For example, the first voltage V2 may be a voltage between about −100 V and about −800 V. In some embodiments, the first voltage V2 may be a voltage less than −200 V, and may be less than −10 V (e.g., −25 V, −5 0V, etc.). In other embodiments, the first voltage V2 may be about −400V.

Additionally, as indicated by the ON state in timing diagram 500, the delivery of the inert gas to the processing volume 129 of the processing chamber 100 continues during the etching process of step 335. The inert gas includes, but is not limited to hydrogen, nitrogen, helium, argon, xenon, krypton, or any combination thereof. In some embodiments, the inert gas essentially comprises argon, helium, xenon, krypton, or combination thereof. The pressure of the inert gas within the processing volume 129 during operation 340 is maintained between about 10 mTorr to about 100 mTorr. For example, the pressure of the inert gas within the processing volume 129 during operation 340 is about 25 mTorr, is about 50 mTorr, or even is about 75 mTorr.

In operation, each of the one or more voltage pulses of the PV waveform 420 are configured to enable the removal of a portion of the organic fill material 608 during the etching process of step 335. As discussed above it is believed that the exposure of the organic fill material 608 to the carbon-free fluorine-containing gas of the process gas increases the sensitivity of the organic fill material 608 to etching process of operation 340. The combination of PV waveform 420 pulses and improved etching process sensitivity allows for improved etching results in the corners, indentations, undercuts, or deviations from a desired feature geometry, in HAR features 612, and other device substrates. In some embodiments, the angularity of the ion bombardment during the etching process may be controlled by adjusting the inert gas pressure, the ion energy, or both, to improve etching results in the corners, indentations, undercuts, or deviations from a desired feature geometry, in HAR features 612, and other device substrates.

In other embodiments, rather than delivering the PV bursts 430 of the PV waveform 420 to the electrode of processing chamber 100 during operation 335, an RF waveform may be delivered from an RF generator (e.g., RF generator 118) to the electrode of processing chamber 100.

At time increment t+4, as indicated by the OFF states in timing diagram 500 delivery of the inert gas, RF waveform 410 and PV bursts 430 halt. During the period between t+4 to t+5, all four variables are shown in the OFF state for ease of viewing by creating a visual separation between the previous steps, step 331, step 333, and step 335, and the subsequent step 339. In practice, step 339, may begin at the end of step 335 (i.e., t+4), or at any point thereafter. At t+5 through t+8, step 339 begins, and continues. Step 339 of operation 330 includes repeating the previous steps, step 331, step 333, and step 335, as needed past t+n until the feature etching process is complete.

At operation 340 of method 300, the device substrate 600 may be optionally exposed to additional processing. For example, cleaning processes, etching processes, deposition processes, or other processes common to device fabrication. Additionally processing may include method 300 where the previous operations, such as operation 320, operation 330, operation 340, may be repeated as needed.

Additional Considerations

While this specification contains many specific implementation details, these should not be construed as limitations on the scope of what may be claimed, but rather as descriptions of features that may be specific to particular implementations. Certain features that are described in this specification in the context of separate implementations may also be implemented, in combination, in a single implementation. Conversely, various features that are described in the context of a single implementation may also be implemented in multiple implementations, separately, or in any suitable sub-combination. Moreover, although previously described features may be described as acting in certain combinations and even initially claimed as such, one or more features from a claimed combination may, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional) to achieve desirable results. In certain circumstances, multitasking or parallel processing (or a combination of multitasking and parallel processing) may be advantageous and performed as deemed appropriate. While the various steps in an embodiment method or process are presented and described sequentially, one of ordinary skill in the art will appreciate that some or all of the steps may be executed in different order, may be combined, or omitted, and some or all of the steps may be executed in parallel. The steps may be performed actively or passively. The method or process may be repeated or expanded to support multiple components or multiple users within a field environment. Accordingly, the scope should not be considered limited to the specific arrangement of steps shown in a flowchart or diagram.

Furthermore, any claimed implementation is considered to be applicable to at least a computer-implemented method; a non-transitory, computer-readable medium storing computer-readable instructions to perform the computer-implemented method; and a computer system including a computer memory interoperability coupled with a hardware processor configured to perform the computer-implemented method or the instructions stored on the non-transitory, computer-readable medium.

As used herein, "a CPU", "controller", "a processor", "at least one processor", or "one or more processors", generally refers to a single processor configured to perform one or multiple operations or multiple processors configured to collectively perform one or more operations. In the case of multiple processors, performance the one or more operations could be divided amongst different processors, though one processor may perform multiple operations, and multiple processors could collectively perform a single operation. Similarly, "a memory", "at least one memory", or "one or more memories", generally refers to a single memory configured to store data and/or instructions, multiple memories configured to collectively store data and/or instructions.

As used herein, "gas" and "fluid" may be used interchangeable with either term generally referring to elements, compounds, materials, etc., having the properties of a gas, a fluid, or both a gas and a fluid.

Unless defined otherwise, all technical and scientific terms used have the same meaning as commonly understood by one of ordinary skill in the art to which these systems, apparatuses, methods, processes and compositions belong.

In this disclosure, the terms "top", "bottom", "side", "above", "below", "up", "down", "upward", "downward," "horizontal," "vertical," and the like do not refer to absolute directions. Instead, these terms refer to directions relative to a nonspecific plane of reference. This non-specific plane of reference may be vertical, horizontal, or other angular orientation.

The singular forms "a", "an", and "the", include plural referents, unless the context clearly dictates otherwise. Within a claim, reference to an element in the singular is not intended to mean "one and only one" unless specifically so stated, but rather "one or more". Unless specifically stated otherwise, the term "some" refers to one or more.

Embodiments of the present disclosure may suitably "comprise", "consist", or "consist essentially of", the limiting features disclosed, and may be practiced in the absence of a limiting feature not disclosed. As used here and in the appended claims, the words "comprise", "has", and "include", and all grammatical variations thereof are each intended to have an open, non-limiting meaning that does not exclude additional elements or steps.

"Optional" and "optionally" means that the subsequently described material, event, or circumstance may or may not be present or occur. The description includes instances where the material, event, or circumstance occurs and instances where it does not occur.

"Coupled" and "coupling" means that the subsequently described material is connected to previously described material. The connection may be a direct, or indirect connection, and may, or may not, include intermediary components such as plumbing, wiring, fasteners, mechanical power transmission, electrical communication, wired and/or wireless transmission, etc., which may suitable to affect operation of the components.

As used, the term "determining" encompasses a wide variety of actions. For example, "determining" may include calculating, computing, processing, deriving, investigating, looking up, for example, looking up in a table, a database, or another data structure, and ascertaining. In addition, "determining" may include receiving, for example, receiving information, and accessing, for example, accessing data in a memory. In addition, "determining" may include resolving, selecting, choosing, and establishing.

When the word "approximately" or "about" are used, this term may mean that there may be a variance in value of up to ±10%, of up to 5%, of up to 2%, of up to 1%, of up to 0.5%, of up to 0.1%, or up to 0.01%.

Ranges may be expressed as from about one particular value to about another particular value, inclusive. When such a range is expressed, it is to be understood that another embodiment is from the one particular value to the other particular value, along with all particular values and combinations thereof within the range.

As used, terms such as "first" and "second" are arbitrarily assigned and are merely intended to differentiate between two or more components of a system, an apparatus, or a composition. It is to be understood that the words "first" and "second" serve no other purpose and are not part of the name or description of the component, nor do they necessarily define a relative location or position of the component. Furthermore, it is to be understood that that the mere use of the term "first" and "second" does not require that there be any "third" component, although that possibility is envisioned under the scope of the various embodiments described.

Although only a few example embodiments have been described in detail, those skilled in the art will readily appreciate that many modifications are possible in the example embodiments without materially departing from the disclosed scope as described. Accordingly, all such modifications are intended to be included within the scope of this disclosure as defined in the following claims. In the claims, means-plus-function clauses are intended to cover the structures described as performing the recited function and not only structural equivalents, but also equivalent structures. It is the express intention of the applicant not to invoke 35 U.S.C. § 112(f), for any limitations of any of the claims, except for those in which the claim expressly uses the words 'means for' together with an associated function.

The following claims are not intended to be limited to the embodiments provided but rather are to be accorded the full scope consistent with the language of the claims.

What is claimed is:

1. A method of forming a device, comprising:

exposing a device substrate to a carbon-free fluorine-containing gas for a first period of time, wherein the device substrate is disposed within a processing volume of a processing chamber, wherein the device substrate comprises:

one or more layers disposed on the device substrate, wherein the one or more layers define at least one high-aspect ratio (HAR) feature, wherein each HAR feature of the at least one HAR feature comprises sidewall surfaces and a bottom surface; and an organic fill material disposed within the at least one HAR feature;

delivering an inert gas to the processing volume for a second period of time; and removing the organic fill material by generating a plasma over the device substrate, wherein the plasma comprises the inert gas, wherein generating the plasma over the device substrate comprises:

delivering a radio frequency (RF) waveform according to an RF delivery period duty cycle, wherein the RF delivery period duty cycle comprises delivering the RF waveform for a third period of time and halting the delivery of the RF waveform for a fourth period of time; and biasing the device substrate, wherein biasing the device substrate comprises delivering a pulsed voltage (PV) burst according to a PV burst delivery period duty cycle to an electrode disposed within the processing chamber, wherein the PV burst delivery period duty cycle comprises delivering the PV burst for a fifth period of time and halting the delivery of the PV burst for a sixth period of time wherein each PV burst comprises a plurality of voltage pulses that have respective on and off periods during a portion of the PV burst delivery period duty cycle, wherein the third period of time and the fifth period of time overlap in time.

2. The method of claim 1, wherein the device substrate further comprises a hardmask material that comprises a material selected from a group consisting of silicon nitride, silicon oxide, amorphous carbon, metals films, metal oxides, polymers, organosilicates, or combination thereof.

3. The method of claim 1, wherein the organic fill material comprises a photoresist or a backside antireflective coating (BARC).

4. The method of claim 1, wherein the carbon-free fluorine-containing gas comprises fluorine ($F_2$), hydrogen fluoride (HF), or deuterium fluoride (DF), or a combination of hydrogen ($H_2$) and nitrogen trifluoride ($NF_3$), or a combination of fluorine ($F_2$) and ammonia ($NH_3$).

5. The method of claim 1, wherein exposing the device substrate to the carbon-free fluorine-containing gas includes introducing the carbon-free fluorine-containing gas into the processing chamber at a rate between about 100 standard cubic-centimeters per minute (SCCM) to about 1000 SCCM.

6. The method of claim 1, wherein the first period of time is between about 1 second to about 3 minutes.

7. The method of claim 1, wherein the second period of time is between about 1 second to about 1 minute.

8. The method of claim 1, wherein the plasma essentially comprises the inert gas that includes argon, helium, xenon, or krypton.

9. The method of claim 1, wherein the PV burst further comprises:

a PV waveform, the PV waveform having a PV waveform duty cycle comprising delivering a first voltage for the fifth period of time to halting delivery of the first voltage for the sixth period of time.

10. The method of claim 9, wherein:

the RF delivery period duty cycle is about 50% to about 95%; and the PV waveform duty cycle is about 10% to about 50%.

11. The method of claim 9, wherein:

the RF delivery period duty cycle is about 50% to about 95%.

12. The method of claim 9, wherein biasing the device substrate comprises delivering the RF waveform to the electrode disposed within the processing chamber.

13. The method of claim 9, wherein the first voltage is between about −50 V and −2000 V.

14. The method of claim 9, further comprising maintaining the device substrate at a cryogenic temperature.

15. A method of device processing, comprising:

exposing a device substrate to a carbon-free fluorine-containing gas for a configurable exposure period, wherein:

the carbon-free fluorine-containing gas comprises fluorine, the device substrate is disposed within a processing volume of a processing chamber, and one or more layers disposed on the device substrate define at least one high-aspect ratio (HAR) feature, wherein each HAR feature of the at least one HAR feature comprises sidewall surfaces and a bottom surface and an organic fill material disposed within the at least one HAR feature;

delivering an inert gas to the processing volume for a configurable purge period; and removing the organic fill material, wherein removing the organic fill material comprises a plasma-assisted etching process, wherein the plasma-assisted etching process comprises:

delivering an inert gas to the processing volume of the processing chamber;

delivering a radio frequency (RF) waveform from a waveform generator coupled to an inductively coupled plasma assembly according to an RF delivery period duty cycle, wherein the RF delivery period duty cycle comprises delivering the RF waveform for a first period of time and halting delivery of the RF waveform for a second period of time;

biasing the device substrate, wherein biasing the device substrate comprises delivering a pulsed voltage (PV) burst according to a PV burst delivery period duty cycle to an electrode disposed within the processing chamber and the PV burst is delivered from a PV source assembly, wherein the PV burst delivery period duty cycle comprises delivering the PV burst for third period of time and halting the delivery of the PV burst for a fourth period of time, wherein the PV burst comprises:

a PV waveform, the PV waveform having a PV waveform duty cycle comprising delivering fifth voltage for sixth period of time and halting delivery of the first voltage for a second period of time and the delivering the first voltage and halting the delivery of the first voltage is cyclically repeated; and simultaneously delivering the RF waveform and the PV burst, wherein delivering the RF waveform and delivering the PV burst overlap in time.

16. The method of claim 15, wherein the device substrate comprises:

a sidewall surface of a sidewall surface of one or more HAR features of the at least one HAR feature-deviates from a desired feature geometry, wherein the desired feature geometry is an approximately straight sidewall surface about normal to the bottom surface.

17. The method of claim 15, wherein:

the RF delivery period duty cycle is about 50% to about 95%; and the PV waveform duty cycle is about 10% to about 50%.

18. The method of claim 15, wherein biasing the device substrate comprises delivering the RF waveform to the electrode disposed within the processing chamber.

19. The method of claim 15, further comprising maintaining the device substrate at a cryogenic temperature.

20. The method of claim 15, wherein the carbon-free fluorine-containing gas comprises fluorine ($F_2$), hydrogen fluoride (HF), or deuterium fluoride (DF), or a combination of hydrogen (H) and a nitrogen fluoride, or a combination of fluorine ($F_2$) and ammonia ($NH_3$).

* * * * *